United States Patent
Feng et al.

(10) Patent No.: US 9,958,748 B2
(45) Date of Patent: May 1, 2018

(54) ARRAY SUBSTRATE AND MANUFACTURING METHOD THEREOF, AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Bo Feng, Beijing (CN); Yu Ma, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days. days.

(21) Appl. No.: 15/516,130

(22) PCT Filed: Mar. 16, 2016

(86) PCT No.: PCT/CN2016/076475
§ 371 (c)(1),
(2) Date: Mar. 31, 2017

(87) PCT Pub. No.: WO2016/169366
PCT Pub. Date: Oct. 27, 2016

(65) Prior Publication Data
US 2017/0307947 A1 Oct. 26, 2017

(30) Foreign Application Priority Data

Apr. 23, 2015 (CN) .......................... 2015 1 0195283

(51) Int. Cl.
*G02F 1/1362* (2006.01)
*G02F 1/1345* (2006.01)
(Continued)

(52) U.S. Cl.
CPC ...... *G02F 1/136227* (2013.01); *G02F 1/1345* (2013.01); *G02F 1/1362* (2013.01);
(Continued)

(58) Field of Classification Search
CPC .................... G02F 1/136227; G09G 3/006; G09G 3/3648; H01L 21/77
See application file for complete search history.

(56) References Cited

U.S. PATENT DOCUMENTS

| 2003/0107037 A1 | 6/2003 | Youn et al. |
| 2006/0001787 A1 | 1/2006 | Lee et al. |

(Continued)

FOREIGN PATENT DOCUMENTS

| CN | 103943627 A | 7/2014 |
| CN | 104795405 A | 7/2015 |

OTHER PUBLICATIONS

International Search Report forms 210, 220, 237 dated Jun. 21, 2016 issued in corresponding International Application No. PCT/CN2016/076475 along with an English translation of the Written Opinion of the International Searching Authority.

*Primary Examiner* — Lixi C Simpson
(74) *Attorney, Agent, or Firm* — Nath, Goldberg & Meyer; Joshua B. Goldberg; Annie J. Kock (57) ABSTRACT

The present application provides an array substrate and a manufacturing method thereof, and a display device, to solve the problem in the prior art that the resistance of the common electrode is large due to an improper layout of the common electrode so that the common electrode is easily affected by other signals to cause voltage fluctuation and thus the quality of the display is influenced. In the array substrate and the manufacturing method thereof, and the display device provided in the present application, since the first common electrode is provided in the source/drain metal layer and the second and third common electrodes are
(Continued)

further formed, connection of the first, second and third common electrodes effectively enables a low-resistance common electrode, which is not easily influenced by other signals to cause voltage fluctuation, therefore, the quality of the display can be improved.

20 Claims, 7 Drawing Sheets

(51) Int. Cl.
*G02F 1/1368* (2006.01)
*G09G 3/00* (2006.01)
*G09G 3/36* (2006.01)
*H01L 21/77* (2017.01)
*H01L 27/12* (2006.01)

(52) U.S. Cl.
CPC ........... *G02F 1/1368* (2013.01); *G09G 3/006* (2013.01); *G09G 3/3648* (2013.01); *H01L 21/77* (2013.01); *H01L 27/12* (2013.01)

(56) References Cited

U.S. PATENT DOCUMENTS

| 2014/0125909 A1* | 5/2014 | Kim ................. G02F 1/134309 349/46 |
| 2015/0035167 A1* | 2/2015 | Wang ............... G02F 1/136286 257/774 |
| 2016/0171946 A1* | 6/2016 | Chen ................ G02F 1/134309 345/58 |
| 2016/0252789 A1* | 9/2016 | Zheng .............. G02F 1/136213 349/43 |

* cited by examiner

ARRAY SUBSTRATE AND MANUFACTURING METHOD THEREOF, AND DISPLAY DEVICE

This is a National Phase Application filed under 35 U.S.C. 371 as a national stage of PCT/CN2016/076475, filed Mar. 16, 2016, an application claiming the benefit of Chinese Application No. 201510195283.4, filed Apr. 23, 2015, the content of each of which is hereby incorporated by reference in its entirety.

TECHNICAL FIELD

The present application relates to the field of display technology, and in particular, to an array substrate and a manufacturing method thereof, and a display device.

BACKGROUND ART

A thin film transistor liquid crystal display (LCD) is the most popular display device, and is adopted in most of the electronic products such as mobile phone screen, monitor screen, TV, etc. Due to its excellent display quality, the thin film transistor liquid crystal display can provide customers with good viewing experience, and thus can occupy a favorable position in the fierce market competition. In particular, a dual-gate thin film transistor liquid crystal display has competitive advantage due to its low cost. However, due to an improper layout of a common electrode in the dual-gate thin film transistor liquid crystal display, the common electrode has large resistance, so that the common electrode is easily affected by other signals to cause a voltage fluctuation, and therefore the quality of the display is influenced, for example, flash occurs during displaying.

SUMMARY

A solution adopted to solve the above problem is an array substrate and a manufacturing method thereof, and a display device.

The present application provides an array substrate comprising a plurality of pixel units arranged in a matrix on a base, each pixel unit is connected to two gate lines and one data line and includes two sub-pixels, each sub-pixel is connected to one corresponding gate line of the two gate lines and the one data line, two gate lines are provided between two adjacent rows of pixel units, and one data line is provided between two adjacent columns of pixel units, wherein the pixel unit comprises a third common electrode provided above the base, a second common electrode provided in a same layer as the gate line and a first common electrode provided in a same layer as a source/drain metal layer, and wherein the first common electrode, the second common electrode and the third common electrode are electrically connected to each other.

Preferably, the first common electrode comprises a first portion, which is parallel to the gate line and provided between two adjacent pixel units in a same column, and a second portion, which is parallel to the data line and provided between the two sub-pixels of the pixel unit, and wherein the first portion and the second portion of the first common electrode are electrically connected to each other.

Preferably, the pixel unit further comprises a first insulation layer provided on the source/drain metal layer and a conductive layer provided on the first insulation layer, and the first portion and the second portion of the first common electrode are electrically connected to each other by the conductive layer through a first part of a third via in the first insulation layer corresponding to the second portion of the first common electrode and a second via in the first insulation layer corresponding to the first portion of the first common electrode.

Preferably, the first part of the third via is located in the first insulation layer at a position corresponding to an end of the second portion of the first common electrode, and the second via is located in the first insulation layer at a position corresponding to a position, corresponding to an end of the second portion, of the first portion of the first common electrode.

Preferably, first common electrodes of two adjacent pixel units in a same row are electrically connected to each other through first vias in the first insulation layer respectively corresponding to the first portions of the first common electrodes.

Preferably, the first via is located in the first insulation layer at a position corresponding to an end of the first portion of the first common electrode.

Preferably, the pixel unit further comprises a second common electrode provided in a same layer as the gate line, and projections of the second common electrode and the second portion of the first common electrode in a direction perpendicular to the base are overlapped partially, and wherein the second common electrode is electrically connected to the first common electrode.

Preferably, a second insulation layer is provided between the gate line and the source/drain metal layer, the third via further comprises a second part penetrating through the source/drain metal layer and a third part penetrating through the second insulation layer, and the first portion and the second portion of the first common electrode and the second common electrode are electrically connected to each other by the conductive layer through the third via.

Preferably, projections of the second common electrode and the second portion of the first common electrode in a direction perpendicular to the base coincide with each other.

Preferably, the second common electrode is provided on the third common electrode.

Another object of the present application is to provide a manufacturing method of an array substrate, comprising steps of:

forming a pattern of a third common electrode on a base through a patterning process;

forming a pattern of a gate, a gate line and a second common electrode above the base, on which the pattern of the third common electrode is formed, through a patterning process, so that the second common electrode is provided on the third common electrode;

forming a pattern of a second insulation layer and a pattern of a third part of a third via located in the second insulation layer above the base on which the pattern of the gate, the gate line and the second common electrode is formed through a patterning process;

forming a pattern of an active layer above the base, on which the pattern of the second insulation layer is formed, through a patterning process;

forming a pattern of a source, a drain, a data line and a first common electrode and a pattern of a second part of the third via located in a source/drain metal layer above the base, on which the pattern of the active layer is formed, through a patterning process;

forming a pattern of a first insulation layer, a pattern of a first part of the third via located in the first insulation layer and a pattern of a first via and a second via above the base, on which the pattern of the source and the drain are formed, through a patterning process; and forming a pattern of a conductive layer above the base, on which the pattern of the first insulation layer is formed, through a patterning process, so that the first common electrodes and the second common electrodes of two adjacent pixel units are electrically connected to each other by the conductive layer through the first via, the second via and the third via.

Another object of the present application is to provide a display device comprising the above substrate.

In the array substrate and the manufacturing method thereof, and the display device provided in the present application, since the first common electrode is provided in the source/drain metal layer, connection of the first common electrode, the second common electrode and the third common electrode effectively enables a low-resistance common electrode, which is not easily influenced by other signals to cause voltage fluctuation, therefore, the quality of the display can be improved, for example, flash is prevented from occurring in the display.

wherein, 1. base; 2. third common electrode; 3. gate line; 31. gate; 32. second common electrode; 4. second insulation layer; 5. data line; 51. first common electrode; 511. first portion; 512. second portion; 6. first insulation layer; 7. conductive layer; 8. third via; 9. second via; 10. first via; 11. sub-pixel; 12. thin film transistor; 13. pixel electrode; 14. pixel unit.

DETAILED DESCRIPTION OF THE EMBODIMENTS

In order to make a person skilled in the art understand solution of the present application better, the application will be described in detail below in conjunction with the drawings and embodiments.

First Embodiment

As shown in FIGS. 1-7, this embodiment provides an array substrate and a manufacturing method thereof.

Figure 1:
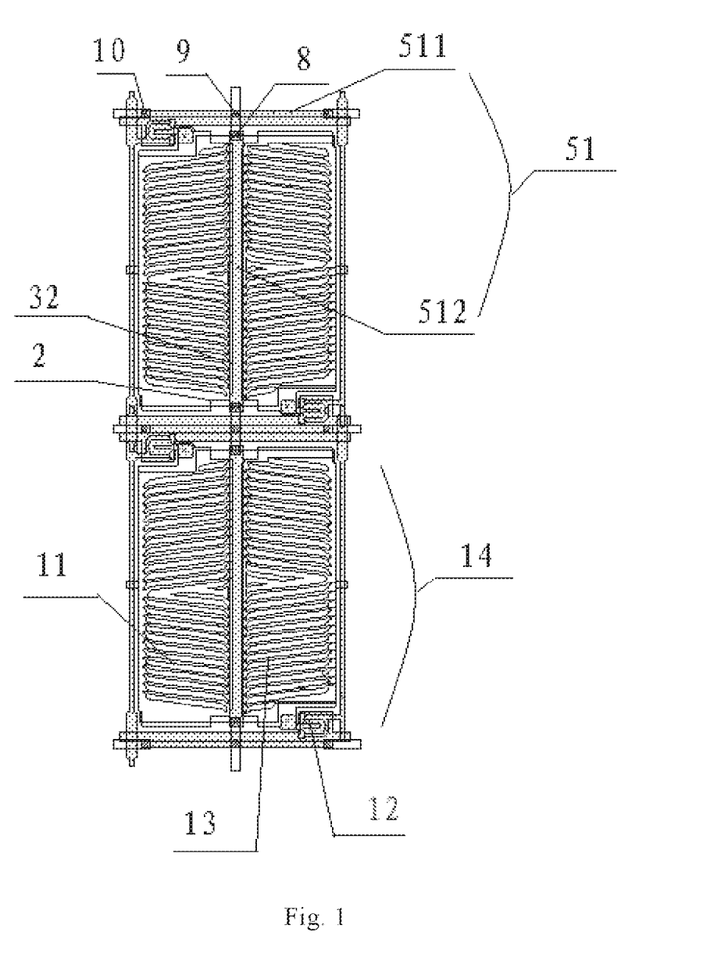
FIG. 1 is a structural diagram of an array substrate in a first embodiment of the present application.

Specifically, the array substrate in this embodiment comprises a plurality of pixel units 14 arranged in a matrix on a base 1, each pixel unit 14 is connected to two gate lines 3 and one data line 5 and includes two sub-pixels 11, each sub-pixel 11 is connected to one corresponding gate line of the two gate lines 3 and the one data line 5, two gate lines 3 are provided between two adjacent rows of pixel units 14, and one data line 5 is provided between two adjacent columns of pixel units 14.

The pixel unit 14 comprises a third common electrode 2 provided on the base 1, a second common electrode 32 provided in a same layer as the gate lines 3, and a first common electrode 51 provided in a same layer as a source/drain metal layer, wherein the first common electrode 51, the second common electrode 32 and the third common electrode 2 are electrically connected to each other.

In this embodiment, since the first common electrode is provided in the same layer as the source/drain metal layer, connection of the first common electrode, the second common electrode and the third common electrode effectively enables a reduced-resistance common electrode, which is not easily influenced by other signals to cause voltage fluctuation, and therefore, the quality of the display can be improved, for example, flash is prevented from occurring in the display.

It should be noted that, the sub-pixel 11 of the above pixel unit 14 may be provided as any one of a red sub-pixel, a green sub-pixel and a blue sub-pixel. For the requirements of displaying, three adjacent sub-pixels 11 may be provided in a sequence of a red sub-pixel, a green sub-pixel and a blue sub-pixel so as to form a display pixel.

Preferably, the first common electrode 51 comprises a first portion 511, which is parallel to the gate line 3 and provided between two adjacent pixel units 14 in a same column, and a second portion 512, which is parallel to the data line 5 and provided between two sub-pixels 11 of the pixel unit 14, wherein the first portion 511 and the second portion 512 of the first common electrode 51 are electrically connected to each other. The first portion 511 is located at a blank region between gate lines 3 for two adjacent pixels 14 in a same column. That is, the first portion 511 and the gate line 3 have no overlapping part in a direction perpendicular to the base 1.

Preferably, the pixel unit 14 further comprises a first insulation layer 6 provided on the source/drain metal layer and a conductive layer 7 provided on the first insulation layer 6, the first portion 511 and the second portion 512 of the first common electrode 51 are electrically connected to each other by the conductive layer 7 through a first part of a third via 8 in the first insulation layer 6 corresponding to the second portion 512 of the first common electrode 51 and a second via 9 in the first insulation layer 6 corresponding to the first portion 511 of the first common electrode 51.

Preferably, the first part of the third via is located in the first insulation layer 6 at a position corresponding to an end of the second portion 512 of the first common electrode 51, and the second via 9 is located in the first insulation layer 6 at a position corresponding to a position, corresponding to an end of the second portion 512, of the first portion 511 of the first common electrode 51. For example, in a case that the pixel unit 14 is divided into two portions of same area by the second portion 512 of the first common electrode 51, that is, the second portion 512 of the first common electrode 51 is located at a center of the pixel unit 14 in a horizontal direction, the second via 9 is located in the first insulation layer 6 at a position corresponding to a middle point of the first portion 511 of the first common electrode 51.

With such a configuration, the two portions of the first common electrode 51 can be electrically connected to each other by the first part of the third via 8 and the second via 9 with a shortest connection wire, so that the resistance of the common electrode is decreased.

Preferably, the first common electrodes 51 of two adjacent pixel units in a same row are electrically connected together through first vias 10 in the first insulation layer 6 corresponding to the first portions 511 of the first common electrodes 51. Thus, all common electrodes on the whole array substrate may be electrically connected together, which can further decrease the resistance of the common electrode.

The first via 10 is located in the first insulation layer 6 at a position corresponding to an end of the first portion 511 of the first common electrode 51. Thus, the first electrodes 51 of two adjacent pixel units 14 can be electrically connected together with a shortest connection wire.

Preferably, the pixel unit 14 further comprises a second common electrode 32 provided in a same layer as the gate lines 3, the projection of the second common electrode 32 and the projection of the second portion 512 of the first common electrode 51 in a direction perpendicular to the base are overlapped partially.

The second common electrode 32 is electrically connected to the first common electrode 51.

Thus, partial overlapping of the second common electrode 32 and the second portion 512 of the first common electrode 51 can ensure area of light transmitting region not to be decreased excessively. Electrical connection between the second common electrode 32 and the first common electrode 51 can further decrease the resistance of the common electrode.

Specifically, a second insulation layer 4 is provided between a gate metal layer from which the gate lines and the gates are formed and the source/drain metal layer. The third via 8 further comprises a second part penetrating through the source/drain metal layer and a third part penetrating through the second insulation layer 4, and the conductive layer 7 electrically connects the first portion 511 and the second portion 512 of the first common electrode 51 with the second common electrode 32 through the first part, the second part and the third part of the third via 8.

Preferably, the projection of the second common electrode 32 and the projection of the second portion 512 of the first common electrode 51 in a direction perpendicular to the base 1 coincide with each other. Thus, complete coincidence of the second common electrode 32 and the second portion 512 of the first common electrode 51 in a direction perpendicular to the base 1 can increase the area of the light transmitting region.

The second common electrode 32 is provided on the third common electrode 2. Thus, the second common electrode 32 can be directly connected to the third common electrode 2 without a via.

In such a manner, the third common electrode 2, the second common electrode 32 and the first common electrode 51 are electrically connected, so that the common electrodes on the whole array substrate are connected to form a common electrode distributed in a net, therefore the resistance of the common electrode is further decreased.

It should be understood that, the third via 8 is a penetrating hole formed by the first part in the first insulation layer, the second part in the source/drain layer and the third part in the second insulation layer, and can be described clearly by dividing it into the three parts.

Figure 2:
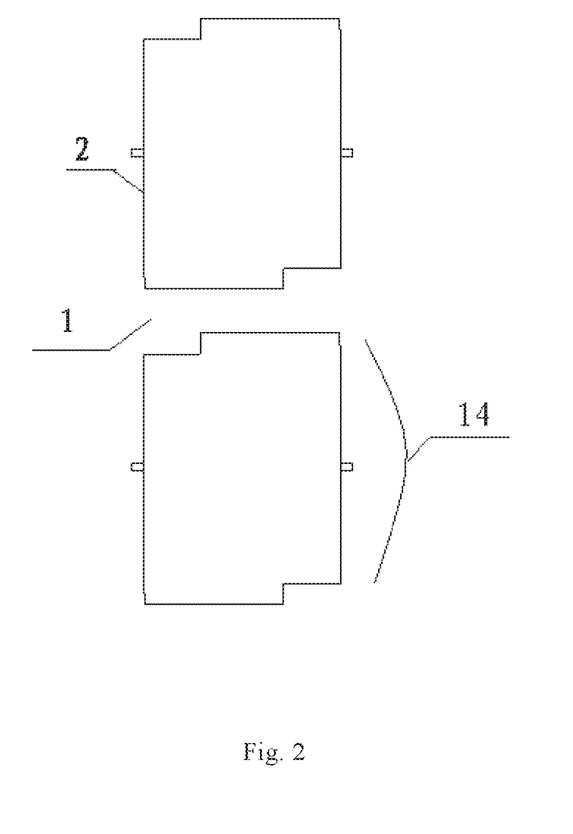
FIG. 2 is a structural diagram of an array substrate on which a third common electrode has been formed in the first embodiment of the present application.

Hereinafter, a manufacturing method of the above array substrate will be introduced, and the manufacturing method comprises the following steps:

S1: coating a transparent metal layer on a base 1, and forming a pattern of a third common electrode 2 through a patterning process including exposure, development and etching steps, the transparent metal layer is an indium tin oxide (ITO) layer.

As shown in FIG. 2, the pattern of the third common electrode 2 is formed above the base 1 by using a known patterning process, and it can be seen from FIG. 2 that the portion covered by the third common electrode 2 is to be formed into a pixel unit 14 thereon.

Figure 3:
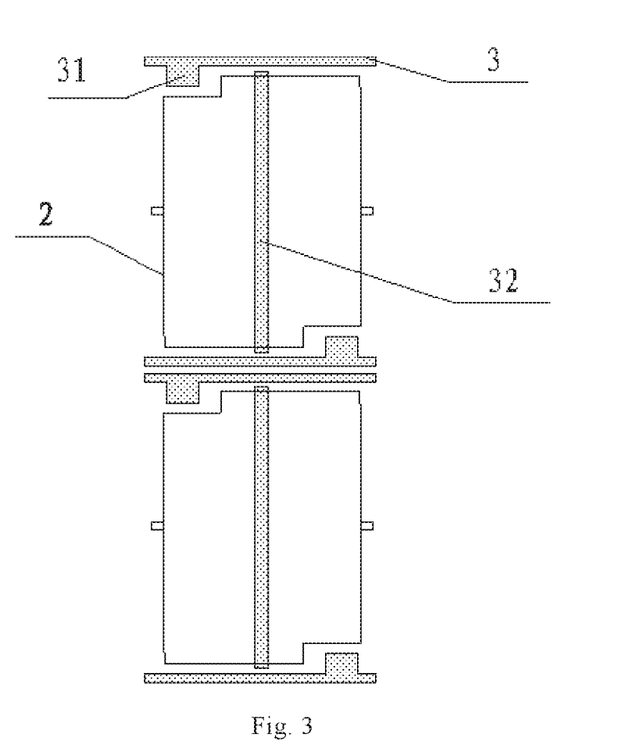
FIG. 3 is a structural diagram of an array substrate on which a gate and a second common electrode have been formed in the first embodiment of the present application.

S2: depositing a gate metal layer above the base 1 on which the pattern of the third common electrode has been formed, and forming a pattern of a gate line 3, a gate 31 and a second common electrode 32 through a patterning process including exposure, development and etching steps, as shown in FIG. 3, wherein a region between the third common electrodes 2 is to be provided with the gate line 3 and the data line 5 therein, thus the third common electrodes 2 and the second common electrode 32 can be directly electrically connected to each other without a via.

Figure 4:
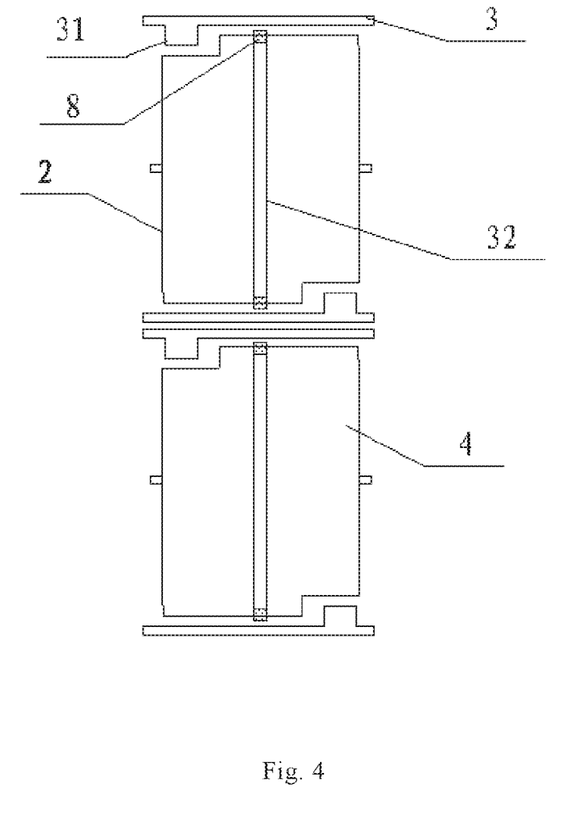
FIG. 4 is a structural diagram of an array substrate on which a pattern of a second insulation layer has been formed in the first embodiment of the present application.

S3: depositing a second insulation layer 4 above the base 1 on which the pattern of the gate line 3, the gate 31 and the second common electrode 32 has been formed, and forming a third part of a third via 8 penetrating through the second insulation layer 4 and corresponding to an end of the second common electrode 32, as shown in FIG. 4.

S4: forming a pattern of an active layer above the base 1 on which the pattern of the second insulation layer 4 has been formed through a patterning process so that the pattern of the active layer is mainly formed on a thin film transistor 12, which is not illustrated in the drawings.

Figure 5:
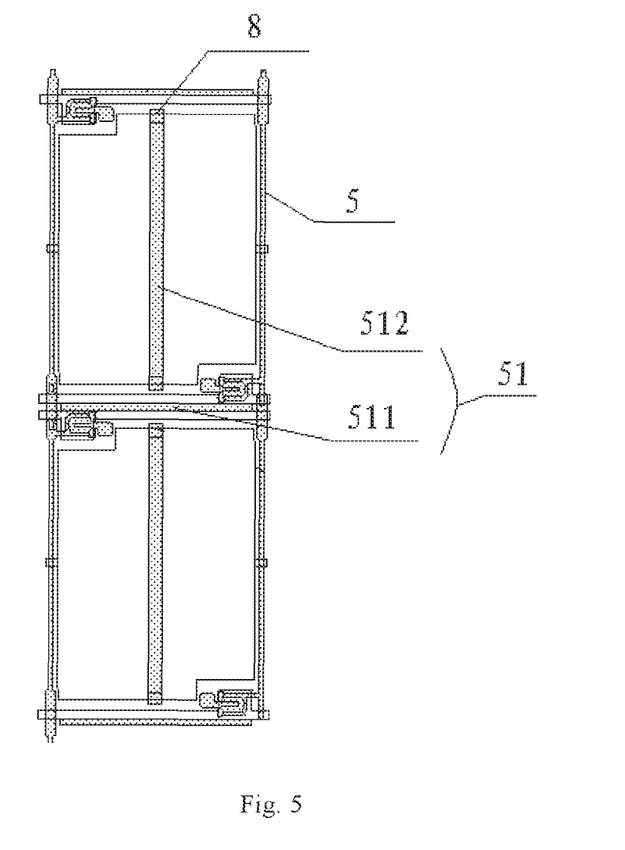
FIG. 5 is a structural diagram of an array substrate on which a first common electrode has been formed in the first embodiment of the present application.

S5: forming a pattern of a source, a drain, a data line and a first common electrode 51 and a pattern of a second part of the third via 8 located in a source/drain metal layer above the base on which the pattern of the active layer has been formed through a patterning process, as shown in FIG. 5.

Figure 6:
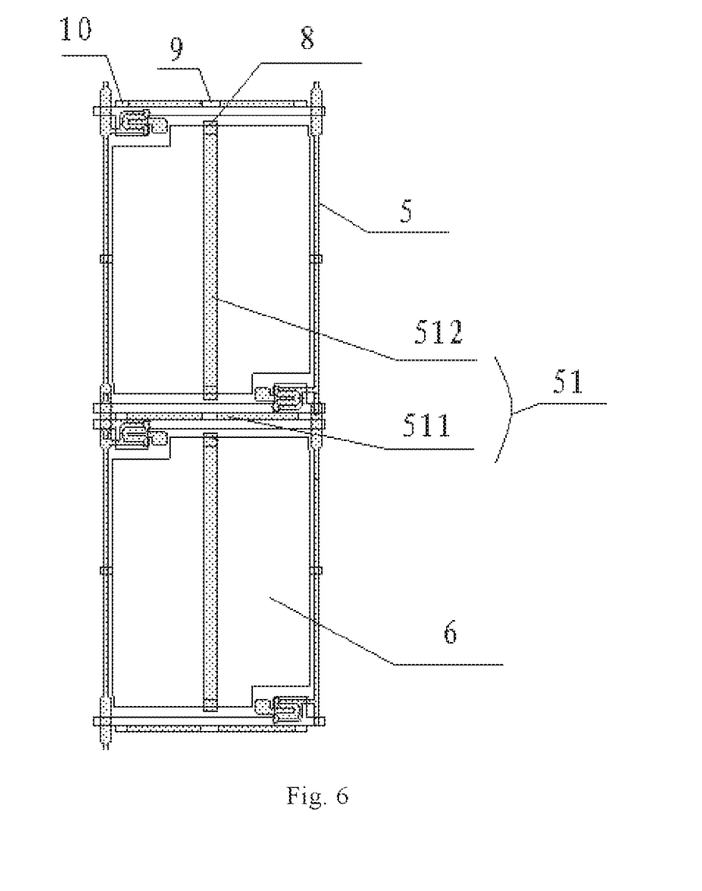
FIG. 6 is a structural diagram of an array substrate on which a pattern of a first insulation layer has been formed in the first embodiment of the present application.

S6: forming a pattern of a first insulation layer 6, a pattern of a first part of the third via 8 located in the first insulation layer 6 and a pattern of a first via 10 and a second via 9 above the base 1 on which the pattern of the source and the drain has been formed through a patterning process, as shown in FIG. 6.

Figure 7:
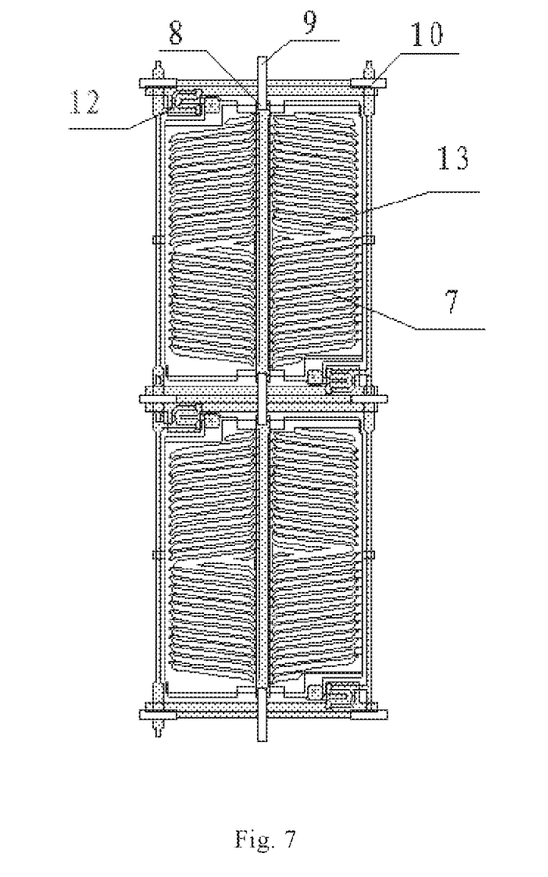
FIG. 7 is a structural diagram of an array substrate on which a pattern of a conductive layer has been formed in the first embodiment of the present application.

S7: forming a pattern of a conductive layer 7 above the base 1 on which the pattern of the first insulation layer 6 has been formed through a patterning process so that the first common electrode 51 and the second common electrode 32 are electrically connected to each other by the conductive layer 7 through the first via 10, the second via 9 and the first part, the second part and the third part of the third via 8, as shown in FIG. 7. It should be understood that, the conductive layer 7 is used to manufacture a pixel electrode 13.

It should be understood that, the third via 8 is a penetrating hole formed by the first part in the first insulation layer, the second part in the source/drain layer and the third part in the second insulation layer, and can be described clearly by dividing it into the three parts.

It should be understood that, the array substrate may further comprise other necessary function layers which will not be described herein.

Second Embodiment

This embodiment provides a display device comprising the above array substrate.

In the above array substrate, the first common electrode is provided in the source/drain metal layer, and a second common electrode and a third common electrode are formed, and connection of the first common electrode, the second common electrode and the third common electrode effectively enables a low-resistance common electrode which is not easily influenced by other signals to cause voltage fluctuation, therefore, the quality of the display can be improved, for example, flash is prevented from occurring in the display.

It should be understood that, the above embodiments are merely exemplary embodiments for describing the principle of the present application, but the present application is not limited thereto. Various modifications and improvements may be made by those skilled in the art without departing from the spirit and essence of the present application, and these modifications and improvements also fall into the protection scope of the present application.

The invention claimed is:

1. An array substrate comprising a plurality of pixel units arranged in a matrix on a base, wherein each pixel unit is connected to two gate lines and one data line and includes two sub-pixels, each sub-pixel is connected to one corresponding gate line of the two gate lines and the one data line, two gate lines are provided between two adjacent rows of pixel units, and one data line is provided between two adjacent columns of pixel units, wherein
the pixel unit comprises a third common electrode provided on the base, a second common electrode provided in a same layer as the gate line and above the third common electrode, and a first common electrode provided in a same layer as a source/drain metal layer, and wherein the first common electrode, the second common electrode and the third common electrode are electrically connected to each other.

2. The array substrate of claim 1, wherein the first common electrode comprises a first portion, which is parallel to the gate line and provided between two adjacent pixel units in a same column, and a second portion, which is parallel to the data line and provided between the two sub-pixels of the pixel unit, and wherein the first portion and the second portion of the first common electrode are electrically connected to each other.

3. The array substrate of claim 2, wherein the pixel unit further comprises a first insulation layer provided on the source/drain metal layer and a conductive layer provided on the first insulation layer, and the first portion and the second portion of the first common electrode are electrically connected to each other by the conductive layer through a first part of a third via in the first insulation layer corresponding to the second portion of the first common electrode and a second via in the first insulation layer corresponding to the first portion of the first common electrode.

4. The array substrate of claim 3, wherein the first part of the third via is located in the first insulation layer at a position corresponding to an end of the second portion of the first common electrode, and the second via is located in the first insulation layer at a position corresponding to a position, corresponding to the end of the second portion, of the first portion of the first common electrode.

5. The array substrate of claim 3, wherein first common electrodes of two adjacent pixel units in a same row are electrically connected to each other through first vias in the first insulation layer respectively corresponding to the first portions of the first common electrodes.

6. The array substrate of claim 5, wherein the first via is located in the first insulation layer at a position corresponding to an end of the first portion of the first common electrode.

7. The array substrate of claim 2, wherein the pixel unit further comprises a second common electrode provided in a same layer as the gate line, and projections of the second common electrode and the second portion of the first common electrode in a direction perpendicular to the base are overlapped partially, and wherein
the second common electrode is electrically connected to the first common electrode.

8. The array substrate of claim 7, wherein a second insulation layer is provided between the gate line and the source/drain metal layer, the third via further comprises a second part penetrating through the source/drain metal layer and a third part penetrating through the second insulation layer, and the first portion and the second portion of the first common electrode and the second common electrode are electrically connected to each other by the conductive layer through the third via.

9. The array substrate of claim 8, wherein projections of the second common electrode and the second portion of the first common electrode in a direction perpendicular to the base coincide with each other.

10. The array substrate of claim 7, wherein the second common electrode is provided on the third common electrode.

11. A manufacturing method of an array substrate, comprising steps of:
forming a pattern of a third common electrode on a base through a patterning process;
forming a pattern of a gate, a gate line and a second common electrode en-above the base, on which the pattern of the third common electrode is formed, through a patterning process, so that the second common electrode is provided on the third common electrode;
forming a pattern of a second insulation layer and a pattern of a third part of a third via located in the second insulation layer above the base, on which the pattern of the gate, the gate line and the second common electrode is formed, through a patterning process;
forming a pattern of an active layer above the base, on which the pattern of the second insulation layer is formed, through a patterning process;
forming a pattern of a source, a drain, a data line and a first common electrode and a pattern of a second part of the third via located in a source/drain metal layer above the base, on which the pattern of the active layer is formed, through a patterning process;
forming a pattern of a first insulation layer, a pattern of a first part of the third via located in the first insulation layer and a pattern of a first via and a second via above the base, on which the pattern of the source and the drain are formed, through a patterning process; and
forming a pattern of a conductive layer above the base, on which the pattern of the first insulation layer is formed, through a patterning process, so that the first common electrodes and the second common electrodes of two adjacent pixel units are electrically connected to each other by the conductive layer through the first via, the second via and the third via.

12. A display device comprising an array substrate, wherein the array substrate comprises a plurality of pixel units arranged in a matrix on a base, wherein each pixel unit is connected to two gate lines and one data line and includes two sub-pixels, each sub-pixel is connected to one corresponding gate line of the two gate lines and the one data line, two gate lines are provided between two adjacent rows of pixel units, and one data line is provided between two adjacent columns of pixel units, and wherein the pixel unit comprises a third common electrode provided on the base, a second common electrode provided in a same layer as the gate line and above the third common electrode, and a first common electrode provided in a same layer as a source/drain metal layer, and wherein the first common electrode, the second common electrode and the third common electrode are electrically connected to each other.

13. The display device of claim 12, wherein the first common electrode comprises a first portion, which is parallel to the gate line and provided between two adjacent pixel units in a same column, and a second portion, which is parallel to the data line and provided between the two sub-pixels of the pixel unit, and wherein the first portion and the second portion of the first common electrode are electrically connected to each other.

14. The display device of claim 13, wherein the pixel unit further comprises a first insulation layer provided on the source/drain metal layer and a conductive layer provided on the first insulation layer, and the first portion and the second portion of the first common electrode are electrically connected to each other by the conductive layer through a first part of a third via in the first insulation layer corresponding to the second portion of the first common electrode and a second via in the first insulation layer corresponding to the first portion of the first common electrode.

15. The display device of claim 14, wherein the first part of the third via is located in the first insulation layer at a position corresponding to an end of the second portion of the first common electrode, and the second via is located in the first insulation layer at a position corresponding to a position, corresponding to the end of the second portion, of the first portion of the first common electrode.

16. The display device of claim 14, wherein first common electrodes of two adjacent pixel units in a same row are electrically connected to each other through first vias in the first insulation layer respectively corresponding to the first portions of the first common electrodes.

17. The display device of claim 16, wherein the first via is located in the first insulation layer at a position corresponding to an end of the first portion of the first common electrode.

18. The display device of claim 13, wherein the pixel unit further comprises a second common electrode provided in a same layer as the gate line, and projections of the second common electrode and the second portion of the first common electrode in a direction perpendicular to the base are overlapped partially, and wherein the second common electrode is electrically connected to the first common electrode.

19. The display device of claim 18, wherein a second insulation layer is provided between the gate line and the source/drain metal layer, the third via further comprises a second part penetrating through the source/drain metal layer and a third part penetrating through the second insulation layer, and the first portion and the second portion of the first common electrode and the second common electrode are electrically connected to each other by the conductive layer through the third via.

20. The display device of claim 19, wherein projections of the second common electrode and the second portion of the first common electrode in a direction perpendicular to the base coincide with each other.

* * * * *